United States Patent
Michael

(10) Patent No.: US 6,778,390 B2
(45) Date of Patent: Aug. 17, 2004

(54) HIGH-PERFORMANCE HEAT SINK FOR PRINTED CIRCUIT BOARDS

(75) Inventor: Mihalis Michael, Antioch, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 09/858,823

(22) Filed: May 15, 2001

(65) Prior Publication Data

US 2002/0172008 A1 Nov. 21, 2002

(51) Int. Cl.⁷ .................................................. H05K 7/20
(52) U.S. Cl. ...................... 361/695; 361/687; 361/692; 361/689; 165/121; 257/717
(58) Field of Search ................... 361/683, 692, 361/697, 685, 688, 689, 703–705, 709–711, 717–719, 722–724, 756, 775; 257/706–727; 165/80.3, 121–126, 104.3, 104.34, 185; 454/184; 307/112, 116, 125, 117, 139; 312/107, 111, 223.1, 223.2, 257.1, 236; 415/177, 178; 174/16.03, 520

(56) References Cited

U.S. PATENT DOCUMENTS

| | | | |
|---|---|---|---|
| 5,535,094 A | 7/1996 | Nelson et al. | |
| 5,689,404 A | 11/1997 | Katsui | |
| 5,727,624 A | 3/1998 | Ko et al. | |
| 5,785,116 A | 7/1998 | Wagner | |
| 5,794,685 A | 8/1998 | Dean | |
| 5,852,547 A | 12/1998 | Kitlas et al. | |
| 5,867,365 A | * 2/1999 | Chiou | 361/690 |
| 5,917,697 A | 6/1999 | Wang | |
| 5,917,698 A | 6/1999 | Viallet | |
| 5,966,286 A | 10/1999 | O'Connor et al. | |
| 5,975,194 A | 11/1999 | Wagner | |
| 5,979,541 A | * 11/1999 | Saito | 165/80.3 |
| 5,992,511 A | 11/1999 | Kodaira et al. | |
| 6,023,413 A | 2/2000 | Umezawa | |
| 6,058,009 A | 5/2000 | Hood, III et al. | |
| 6,088,225 A | 7/2000 | Parry et al. | |
| 6,109,341 A | 8/2000 | Kodaira et al. | |
| 6,125,924 A | 10/2000 | Lin | |
| 6,130,819 A | 10/2000 | Lofland et al. | |
| 6,152,214 A | 11/2000 | Wagner | |
| 6,158,502 A | 12/2000 | Thomas | |
| 6,166,904 A | 12/2000 | Kitahara et al. | |
| 6,167,948 B1 | 1/2001 | Thomas | |
| 6,173,576 B1 | 1/2001 | Ishida et al. | |
| 6,179,561 B1 | * 1/2001 | Horng | 415/208.3 |

FOREIGN PATENT DOCUMENTS

JP         408255855 A   * 10/1996   ........... H01L/23/36

* cited by examiner

*Primary Examiner*—Michael Datskovsky
(74) *Attorney, Agent, or Firm*—Cooley Godward LLP

(57) ABSTRACT

An apparatus and method are described for cooling electronic components on a plug-in or other computer board placed within an enclosure. The inventive apparatus and system is capable of cooling a high power dissipating device, such as a Graphics Processing Unit and cooling individual ones of a plurality of other devices, such as memory chips, to within a specified temperature range. In one embodiment, cooling air is drawn from the edge of a plug-in card, over the GPU and is directed along and over arrays of memory chips. By directing the flow on and along the memory chips, a flow is established that maintains the chip-to-chip temperature difference to within a desired, uniform range. The invention allows for the incorporation of higher performance processors onto boards while maintaining memory chips within a temperature range that allows for predictable performance.

23 Claims, 11 Drawing Sheets

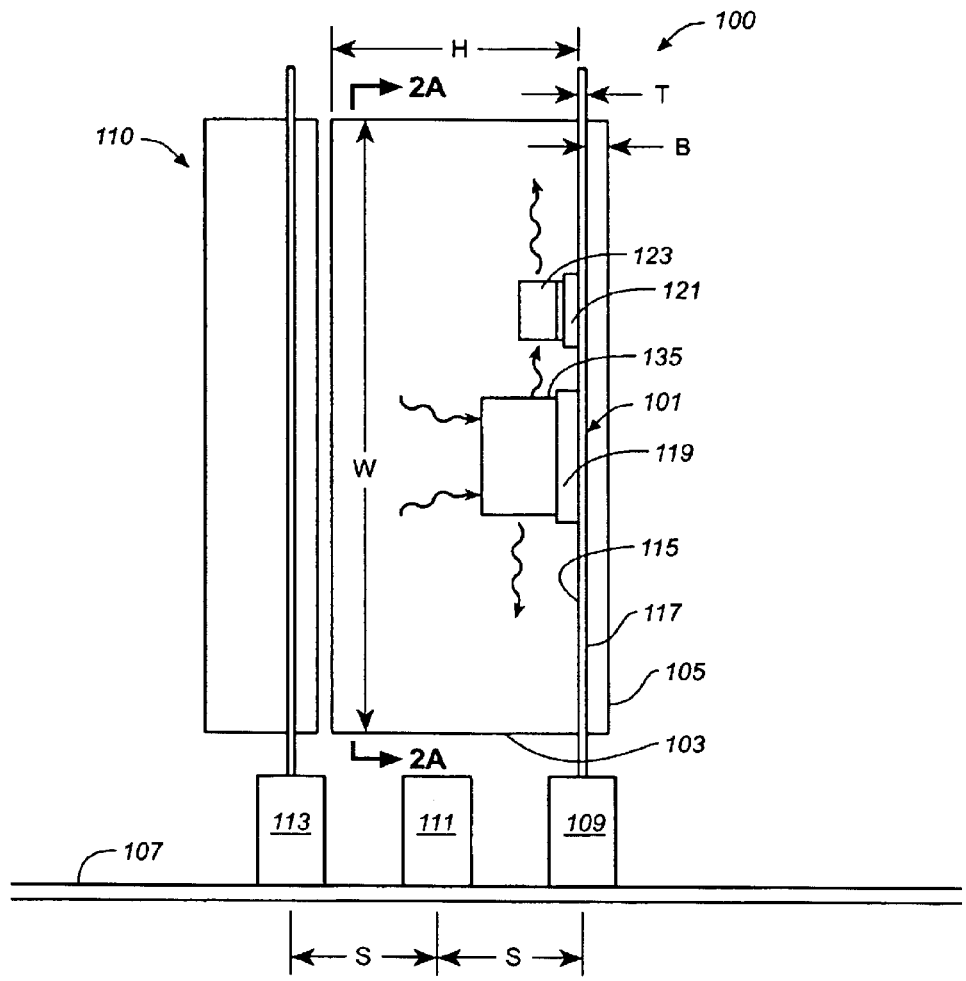
FIG._1
(PRIOR ART)
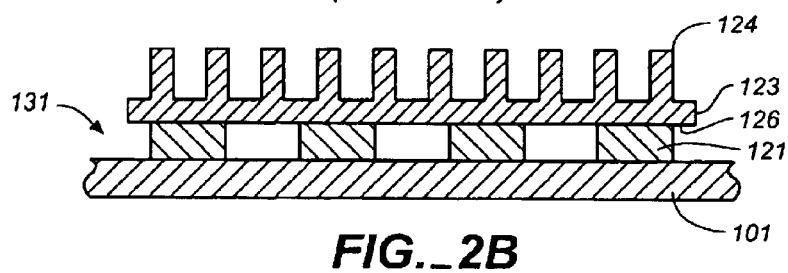
FIG._2B
(PRIOR ART)

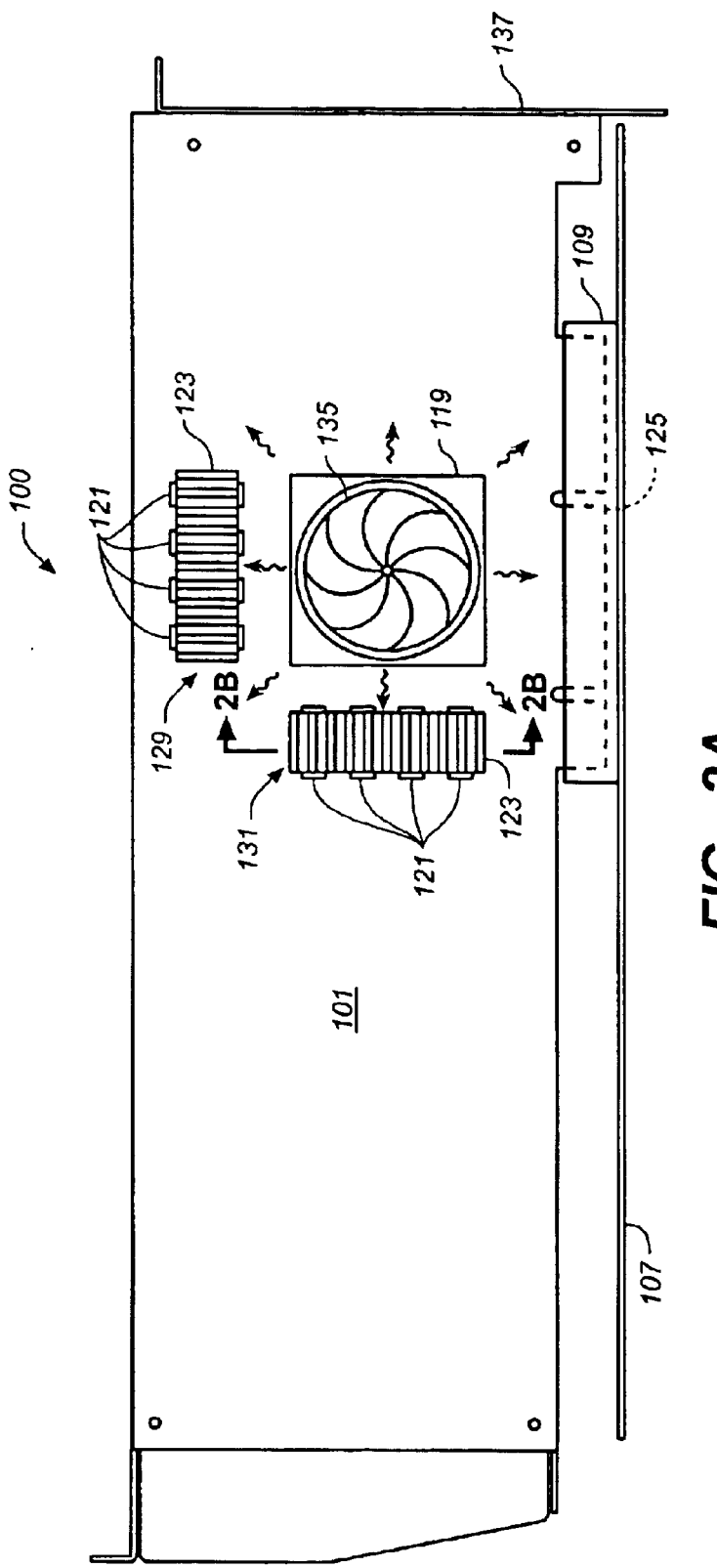
FIG._2A
(PRIOR ART)

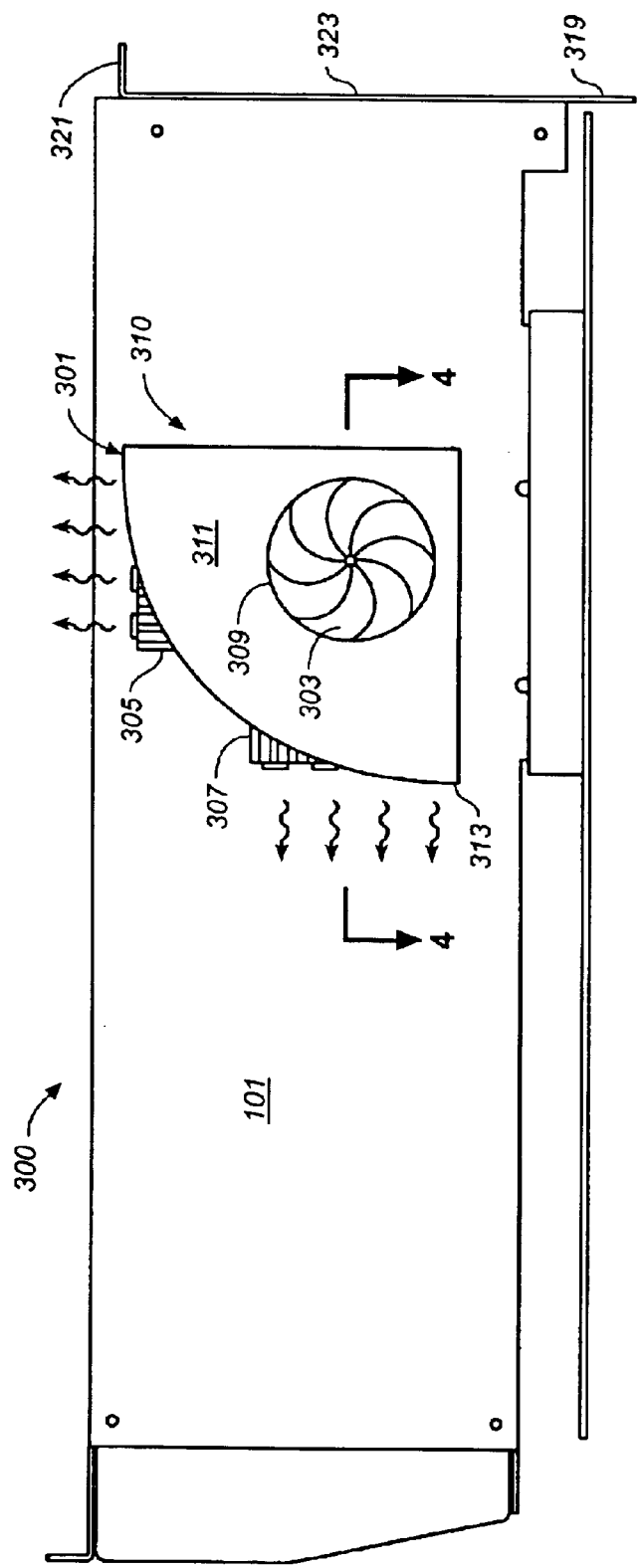
FIG._3

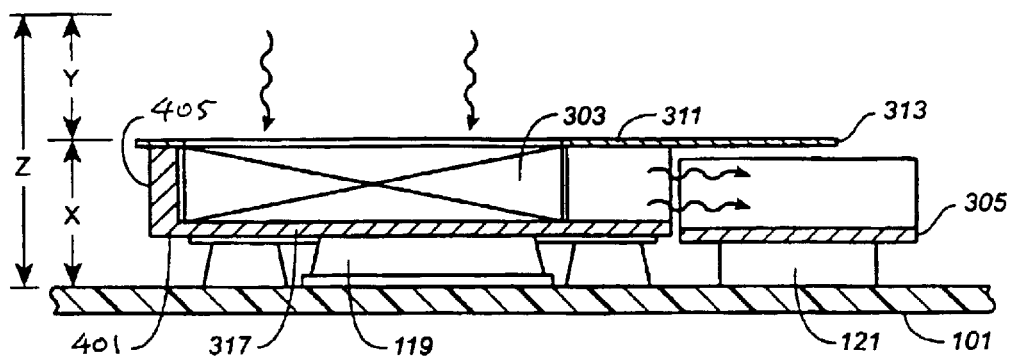
FIG._4
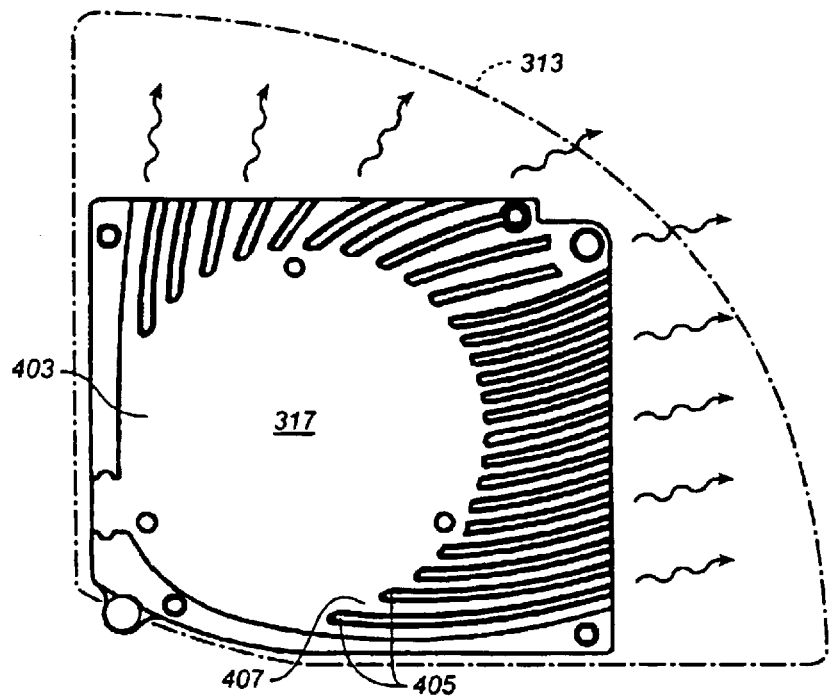
FIG._6

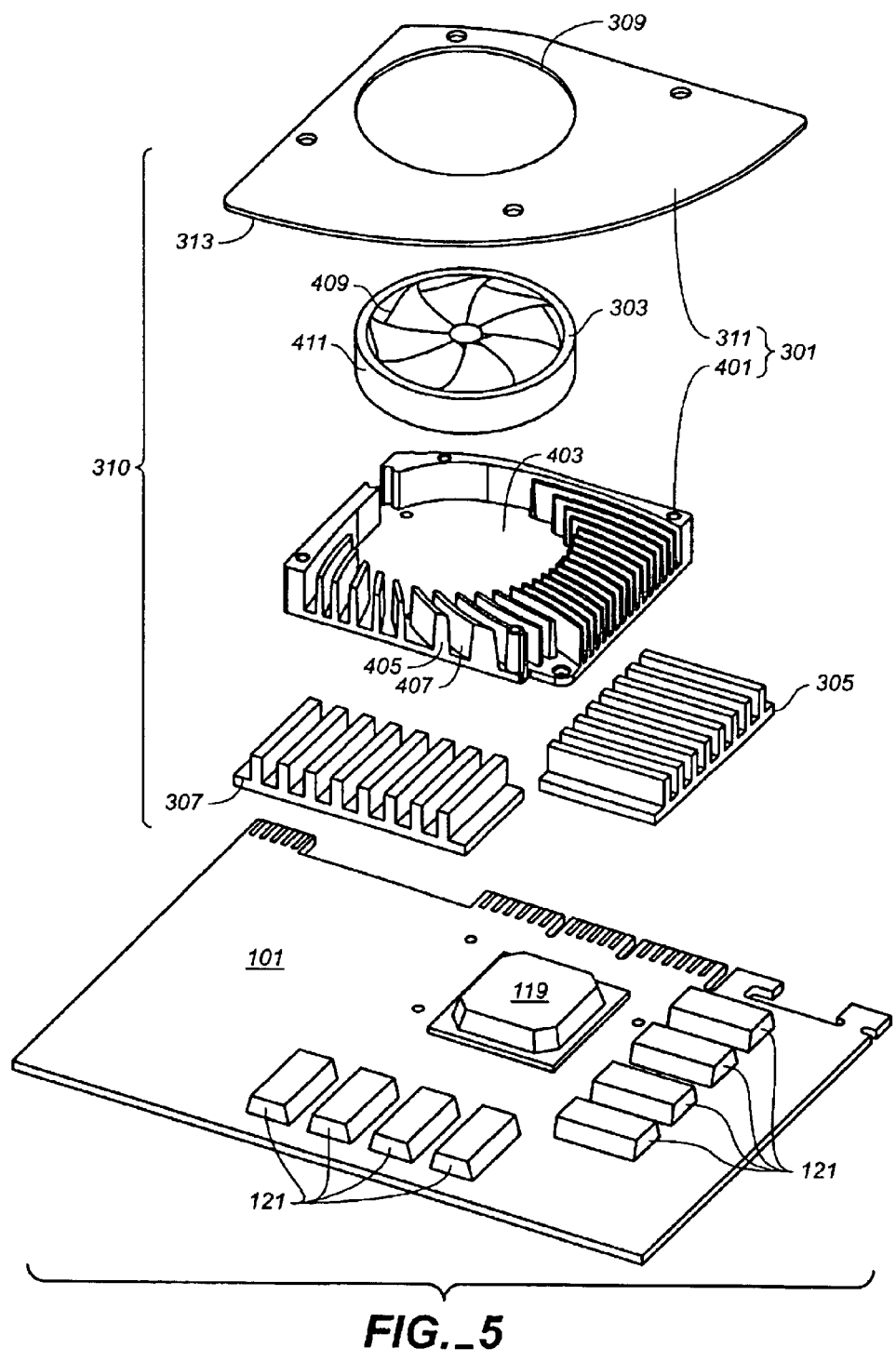
FIG._5

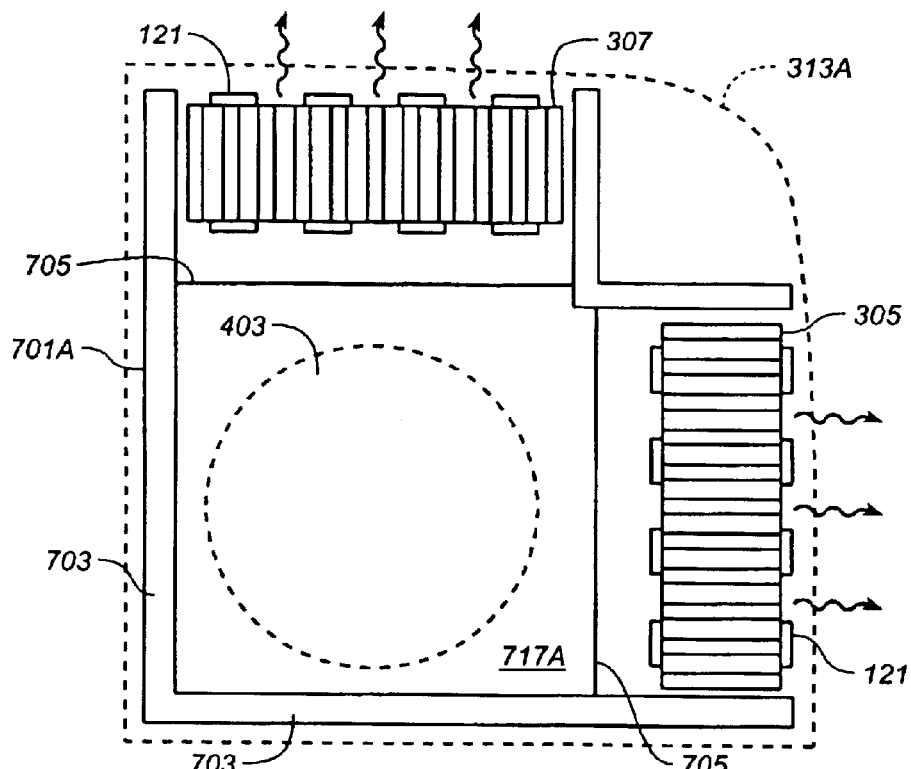
FIG._7A
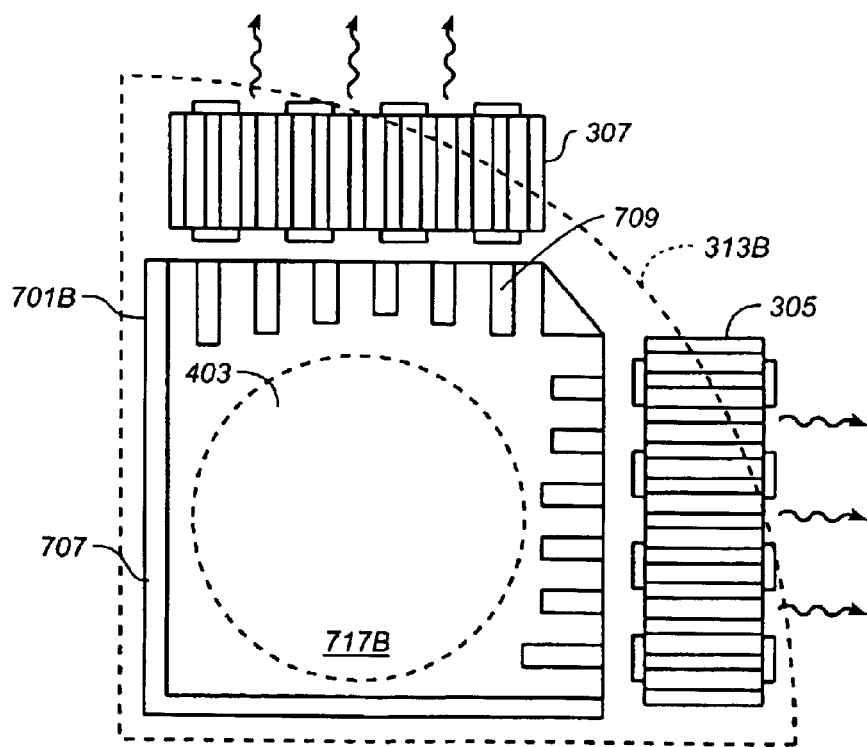
FIG._7B

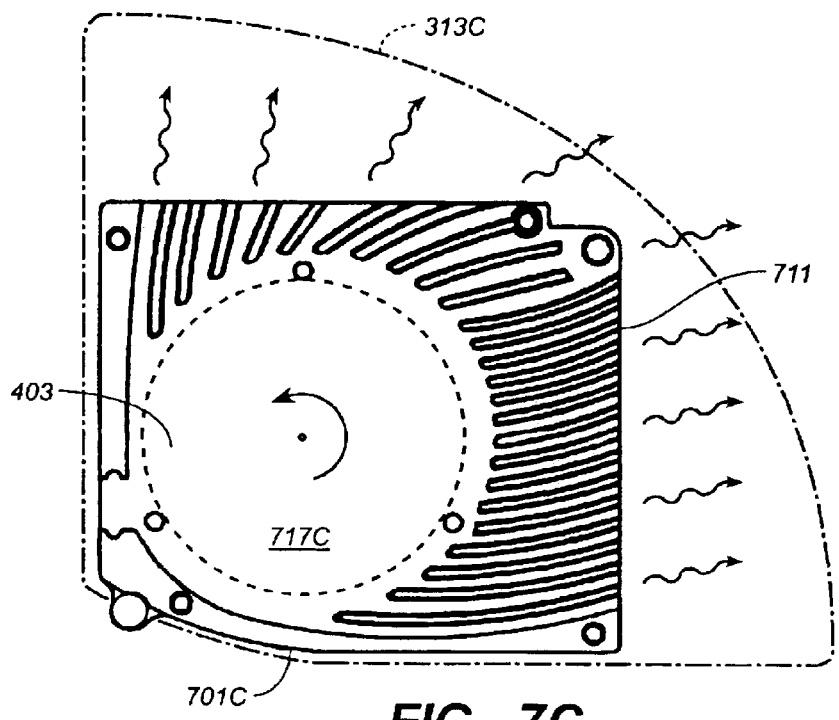
FIG._7C
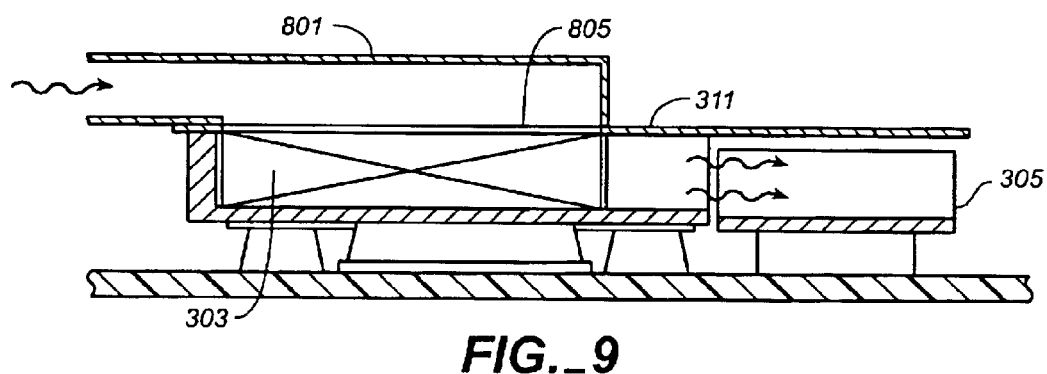
FIG._9

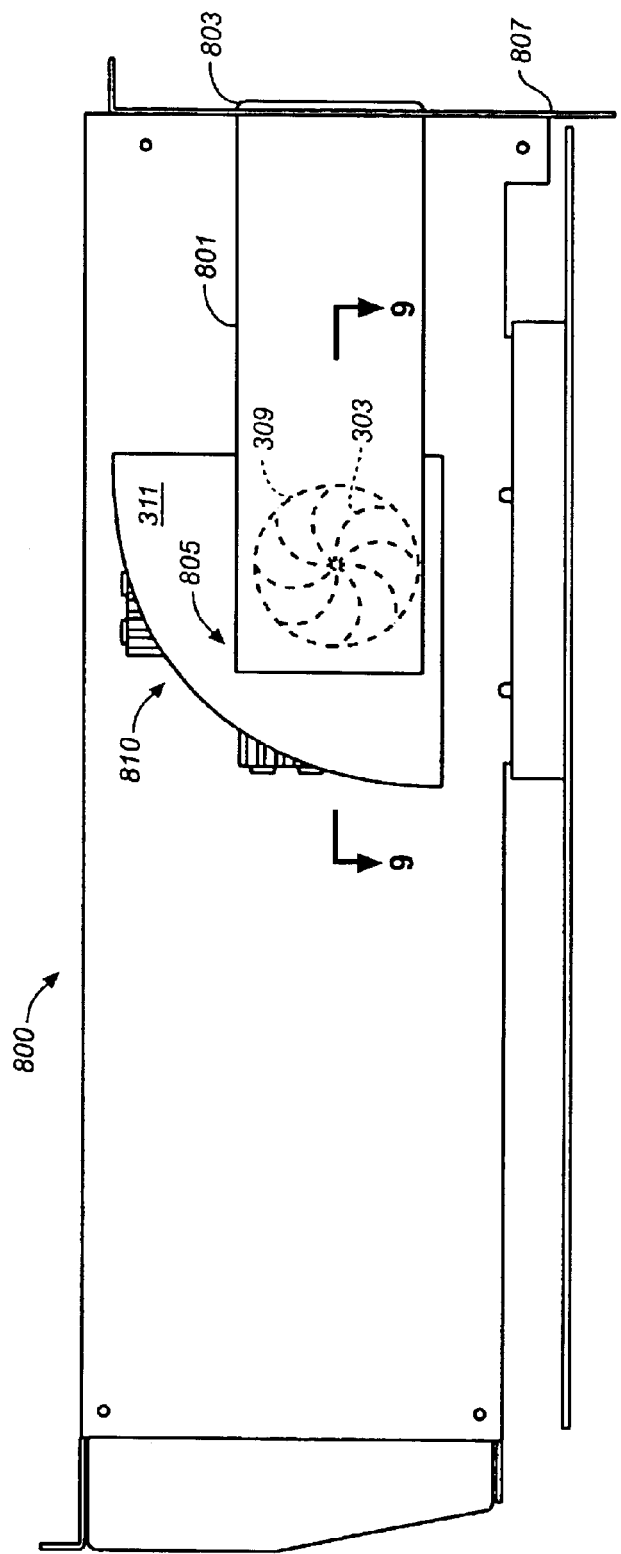

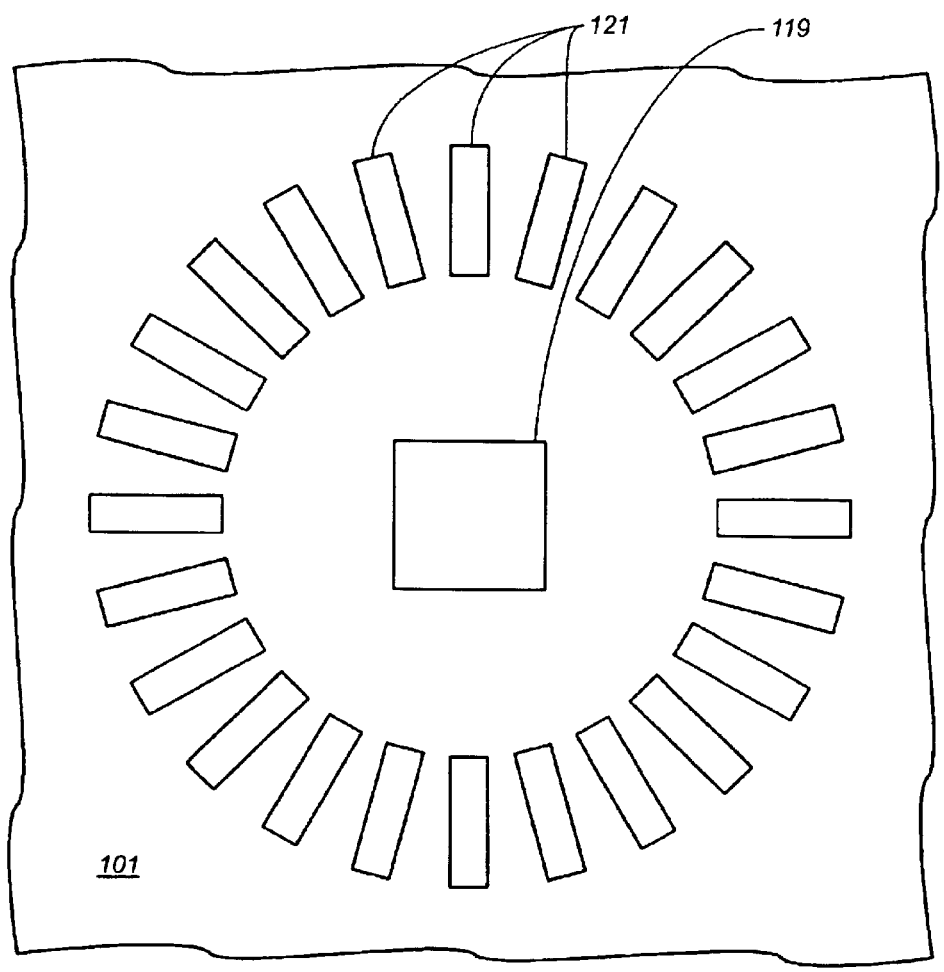
FIG._10

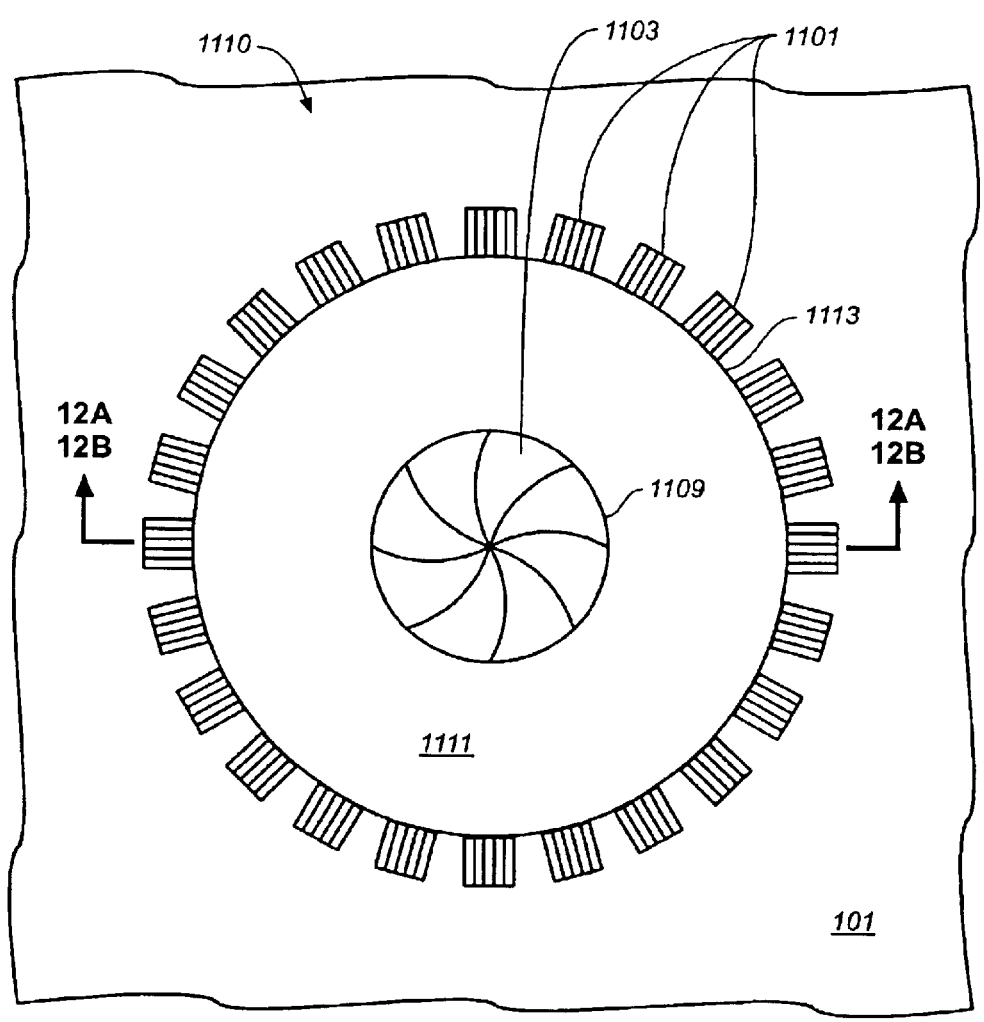
FIG._11

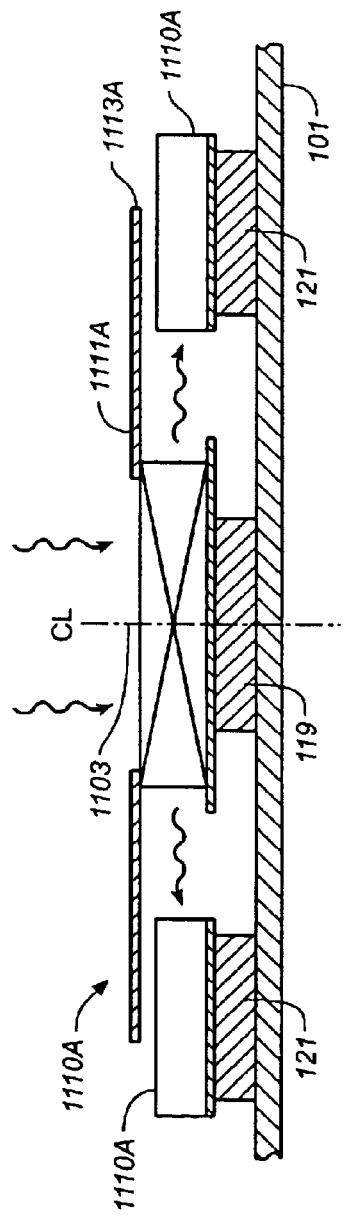
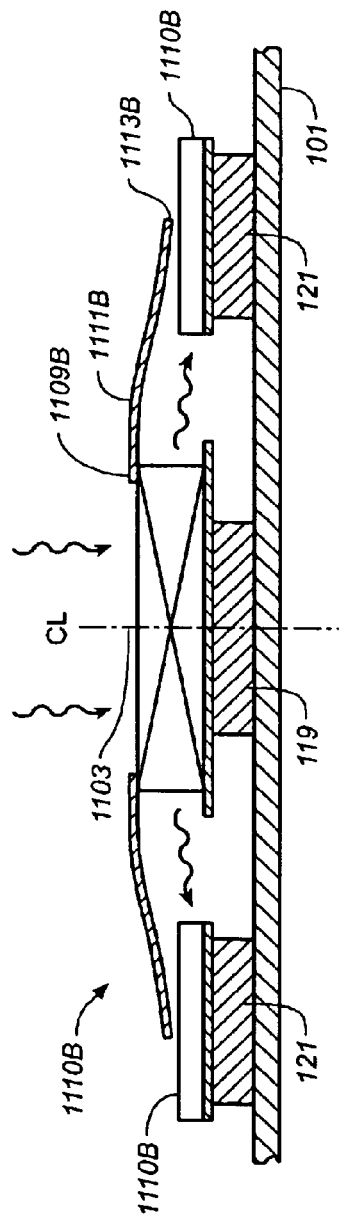

HIGH-PERFORMANCE HEAT SINK FOR PRINTED CIRCUIT BOARDS

FIELD OF THE INVENTION

The present invention is related to the field of cooling components on a printed circuit board. More specifically, the present invention is directed to an apparatus and method for providing improved heat transfer to a plurality of chips on a printed circuit board.

BACKGROUND OF THE INVENTION

The ability to arrange electronic components on printed circuit boards having standard sizes allows for the easy configuration, assembly, repair and upgrading of electronic devices. Personal computers, for example, typically include a motherboard having multiple standardized ports or buses which include slots or connectors for attaching boards or cards. As a testament to the flexibility of this approach, connectors are included in nearly every personal computer, allowing for the addition of computer memory, connections to input/output (I/O) devices, and additional computing power.

Bus standards include, but are not limited, the Peripheral Component Interconnect (PCI) and the Industry Standard Architecture (ISA) standards, both of which have general utility, and the Accelerated Graphics Port (AGP) standard, which is designed for improving the graphics capabilities of computers. Each of these standards includes electrical and electronic standards for providing computational functions and mechanical standards to assure that the connectors and cards mate to provide the required electrical connections and physical stability. Of particular interest here are the mechanical standards, which include but are not limited to details of the geometrical configuration of the card edge that mates with the connector, the width, length and height of the assembled board, and the electrical specifications and power use of the card.

In addition to meeting the bus standards, it is important that card components including, but not limited to processors, memory chips, power supplies, and other electronic components, are operated within prescribed temperature limits. For high-power dissipating devices such as power supplies and processors, it is generally required that the operating temperature be kept below a maximum operating temperature. For boards having a plurality of temperature-sensitive components within the same circuit, maintaining individual chip temperatures within a range that allows all chips to operate the same. Thus, for example, memory chips often have temperature-dependent clock speeds. Circuits that have memory chips in parallel operate best if all the chips are within some temperature range, and thus have the same approximate clock speed.

Techniques for removing heat from electronic components has evolved with cooling demands. Fans of various types are used to force air out of the back of the enclosure or to force fresh air into the enclosure. In either case, such fans induce internal circulation and promote convective heat transfer from heat generating components. Other techniques include using more than one fan or ducting the flow within the enclosure to improve heat removal. On the component level, the use of passive heat sinks for heat removal from individual components is well known in the art. Axial fans or blowers are often added to high heat generating and temperature sensitive components, such as processors. These air moving devices increase the local heat transfer, moving thermal energy from one or several components into the enclosure. Techniques for improving heat sink contact with components have also been developed, as have active heat removal systems, such as heat pipes and Peltier devices.

The trend in recent years has been towards placing faster, more powerful computer chips having increased dissipation on each printed circuit board. These boards are normally stacked close to achieve a compact overall design. Stacking the boards may hinder the ability of the air to circulate near hot components, and may also reduce the effectiveness of chip or heat sink mounted fans or blowers. In addition, many high-end cards, such as GPUs, include a processor having a dedicated fan and other computer chips that should be operated at or near the same temperature. For example boards conforming to the AGP standard usually include a high power dissipating GPU and banks of clock-speed temperature-dependent memory chips, sometime laid out along two perpendicular lines about the GPU. Cooling systems thus need to cool the GPU to keep it from overheating and maintain a plurality of memory chips at or near the same temperature. The prior art methods are not sufficient to maintain several components, chips or sets of chips on one printed circuit board at or near a specified temperature. In addition, board standards require keeping all components within a specified height of the board so that adjacent slots can be used for other boards.

An example of a prior art problem and solution to a beat removal problem, as encountered in the design of an AGP board, is shown with reference to prior art FIGS. 1 and 2, which show the design specifications and component layout for an AGP card capable of consuming 50 Watts of power (a "AGP Pro50" card). The AGP Pro specification is being adopted to accommodate AGP-like cards that have greater power consumption and may require more space on the motherboard than does an AGP standard board. FIG. 1 shows an edge view of a motherboard 107 having an AGP Pro connector 109, a PCI card 110, and adjacent PCI connectors 111 and 113. AGP Pro connector 109 and PCI connectors 111 and 113 are parallel, are aligned with the length L of card 101, and are separated by a distance S. An AGP Pro compatible device 100 having a card 101 with a component side 115 and solder side 117 has a protruding portion 125 for electrically mating with connector 109, and a bracket 137 for fixing the AGP Pro compatible device to the computer frame (not shown). Bracket 137 is usually located near a wall of the computer enclosure and has an I/O connector mounted thereon (not shown) for making connections outside of the computer. An outline 103 specifies the maximum width W and height H of objects associated with component side 115, and an outline 105 specifies the maximum width W arid height B of objects associated with solder side 117. Of particular interest is outline 103. The original specifications for an AGP card call for an AGP compliant card to take up only the space between the AGP board and the next closest board (a height H less than S-B). Principally because of the increased power consumption, the original AGP standard was modified into an AGP Pro50 standard, which allows a card occupy a height H which overlaps the space of the adjoining PCI slots 111. The next closest position for inserting PCI card 110 is PCI connector 113, PCI cards that might have occupied PCI connector 111 are not available for use when AGP card 100 is in connector 109.

FIG. 2A shows a top view 2A—2A of AGP card 100 from FIG. 1 showing various components to be cooled and a prior art method of cooling, and FIG. 2B shows a cross-sectional view of memory chips 121 and heat sink 131. Mounted on card 101 are a GPU 119 and a plurality of memory chips 121 arranged along two rows 129 and 131. Mounted on GPU 119 is a fan 135 for cooling the various components. Fan 135 is typically a vertical fan that draws air above card 100 as shown in FIG. 1 and towards GPU 100 to produce a vertical convective flow that subsequently flows over card 100 as shown by the arrows emanating from fan 135. Each of the rows 129 and 131 of memory chips 121 has a heat sink 123 placed on top of the memory chips and having fins that protrude away from card 100. As shown on FIG. 2B, heat sink 123 has a substantially flat bottom 126 that is in thermal contact with memory chips 121, and fins 124 that protrude away from the bottom. Heat sink 123 is of a material having a high thermal conductivity, usually a metal such as aluminum or copper. Fins 124 provide increased surface area for heat transfer, either through natural convection or by forced convection as shown by the flow of FIG. 1. While some portion of the flow from fan 135 is directed over heat sinks 123, the flow is generally diverging. This flow pattern has several adverse consequences, including having only a portion of the flow available to cool memory chips 121, providing uneven cooling between chips or along heat sink 123, and the possibility of allowing for flow separation or recirculation near the chips.

In general, the prior art solution to accommodate increased power dissipation is to increase the height H to allow for more circulation or for the inclusion of a larger fan or more advanced cooling devices. The AGP compatible device 100 thus becomes larger and overlaps with space that could otherwise be used by PCI cards. Unfortunately, increasing the board size or footprint is not an optimal method of accommodating increased power demands. Increasing the acceptable board size blocks access to adjacent slots, and thus reduces the computer's capabilities and wastes wiring and connectors that already exist on the motherboard, and also results in a bulkier and possibly more expensive card.

What is needed is a method and/or apparatus that provides improved heat transfer characteristics for printed circuit boards. Specifically, there is a need to provide cooling to allow a plurality of computer chips to operate at approximately the same temperature within the confines of a computer enclosure. The operation of many types of computer chips is temperature sensitive, and the ability to cool a plurality of chips to approximately the same temperature allows for more reliable operation of the board. In particular, such a capability would allow for higher performance computer plug-in boards, such as graphics processors. In addition, there is a need to improve heat removal from boards so that boards having higher power dissipation can be cooled without increasing the amount of space taken up by the board within a computer enclosure.

SUMMARY OF THE INVENTION

The present invention provides an apparatus and method for cooling components within the confines of closely spaced printed circuit boards within an enclosure that allows for improved cooling. Specifically, the inventive cooling arrangement allows for enhanced and more accurate and predictable cooling of components on a computer board, thus allowing for higher performance of the board, such as operating at higher speed.

It is thus one aspect of the present invention to provide an apparatus and method for cooling a plurality of components on a computer board that maintains each of the components at a specified temperature or within a specified temperature range. In one embodiment, the cooling arrangement includes ducting to direct cooling flow from one or more fans along each of the computer chips. Embodiments for providing cooling flow include drawing air from a location internal to the computer enclosure and drawing in air external to the enclosures. Another embodiment provides cooling to a plug-in board adjacent an enclosure opening along the edge of the board, where the cooling air is ducted from an opening that falls within the height specification of a standard plug-in board. The chips may have heat sinks attached thereto, and the cooling flow may be directed along the heat sinks.

It is another aspect of the present invention to provide an apparatus and method for cooling components on a computer board by providing a housing for mounting one or more fans and elongated members such as fins or vanes to direct flow along the board and specifically along a plurality of components to be cooled. It is yet another aspect of the present invention to cool a plurality of electronic components by directing the flow over heat sinks attached to the plurality of electronic components. In one embodiment the plurality of components are arranged as two perpendicular array of components, and the flow is directed perpendicularly to the components, and a second embodiment arranges the plurality of components radially. The fans of the inventive cooling apparatus are alternatively placed on a heat sink that cools a high power consuming component, such as a GPU, while the flow is directed to cool a plurality of memory chips to within a given temperature range.

It is yet another aspect of the present invention to provide improved cooling to a standard sized computer plug-in board within a set height specification to allow for higher performance boards to occupy a defined physical space. In one embodiment, the inventive cooling system includes ducting to direct flow over heat sinks placed on arrays of computer components, such as memory chips, the cooling system including a heat sink with fans attached, elongated members for directing flow over the computer components, and a cover to further direct the flow.

It is another aspect of the present invention to cool a plug-in board while occupying less height over the board. One embodiment provides for cooling an AGP compatible plug-in board, including the GPU and memory chips, within the space confines of standard AGP height for large power consuming boards, such as boards consuming more than 50 watts of power. In one embodiment, a GPU has a heat sink attached that accepts a fan that draws in air away from the board and directs the flow towards memory chips that can cool each memory chip to within a specified temperature range within the width of regulation AGP board. The board may include one or more fans and may also include ducting to draw air in fresh cooling air from the point at which the AGP board meets a computer enclosure opening. It is yet another aspect of the present invention to provide cooling to components on computer boards using apparatus and methods have economic advantages by improving the performance or allowing for higher performance within the same amount of space within a computer.

A further understanding of the invention can be had from the detailed discussion of specific embodiments below. For purposes of clarity, this discussion refers to devices, methods, and concepts in terms of specific examples. However, the method of the present invention may operate with a wide variety of types of devices. It is therefore intended that the invention not be limited by the discussion of specific embodiments. For purposes of clarity, the invention is described in terms of systems that include many different innovative components and innovative combinations of components. No inference should be taken to limit the invention to combinations containing all of the innovative components listed in any illustrative embodiment in this specification.

Additional objects, advantages, aspects and features of the present invention will become apparent from the description of preferred embodiments, set forth below, which should be taken in conjunction with the accompanying drawings, a brief description of which follows.

BRIEF DESCRIPTION OF THE DRAWINGS

The invention will be better understood by reference to the Figures of the drawings wherein:

FIG. 1 is an edge view of a prior art computer motherboard and AGP card;

FIG. 2A is an top view of a prior art computer motherboard and AGP card;

FIG. 2B is sectional view 2B—2B of FIG. 2A of a memory chip and prior art heat sink;

FIG. 3 is a top view of a first embodiment of a cooling device of the present invention;

FIG. 4 is sectional side view 4—4 of FIG. 3;

FIG. 5 is an exploded assembly view of FIG. 3;

FIG. 6 is top view of a fan housing of the first embodiment;

FIGS. 7A–7C each present one alternative embodiment of an augmented heat removal system for directing flow;

FIG. 8 is a top view of a second embodiment cooling device;

FIG. 9 is a sectional side view 8—8 of FIG. 8;

FIG. 10 is a top view of an alternative radial memory chip layout;

FIG. 11 is a top view of a cooling device for the radial memory chip layout; and FIGS. 12A and 12B are sectional side views of a first and second embodiment radial cooling device, respectively, of FIG. 11.

Reference symbols are used in the Figures to indicate certain components, aspects or features shown therein, with reference symbols common to more than one Figure indicating like components, aspects or features shown therein. The reference symbols used herein are not to be confused with any reference symbols used in the items that have been incorporated herein by reference.

DESCRIPTION OF SPECIFIC EMBODIMENTS

The present invention provides apparatuses and methods for improving the heat transfer from arrangements of electronic components. The following description of the invention is facilitated by reference to embodiments that illustrate the various aspects of the invention. These embodiments provide a framework for describing the present invention, and include details of the type and relative placement of components, the configuration of the components on cards or printed circuit boards, the structure and shape of elements holding the components, the intended purpose of the components, cards or device in which they reside, and other specifics. In particular, the above-mentioned specifics are illustrative and are not meant to limit the scope of the present invention as provided in the attached claims.

By way of example, the invention will be described in terms of an apparatus and method for cooling electronic components arranged on a printed circuit board for use in a personal computer. Specific examples of electronic components include computer chips or other electronic components and electrical components, such as power supplies or power conditioning electronics. Electronic components may be arranged on cards, such as printed circuit boards, that are used to perform specific functions or can be programmed to perform various functions, either internal to an electronic device or as in an input/output interface. It is common to provide plug-in locations within an electronic device, for example on a motherboard, for one or more such cards, and thus the cards are sometimes referred to as plug-in cards or add-in cards. In the computer architecture commonly in use, such cards need conform to specifications of the size, space and power, as well as the location of electrical and mechanical connections and digital, electronic and electrical functionality, as appropriate. A plurality of such plug-in locations are usually provided and configured such that the plurality of plugged in cards form a stacked arrangement extending perpendicular to the motherboard. As noted previously, the stacked arrangement, while providing a compact computer design, can hinder the cooling of components on the boards and thus the operation of the computer.

The inventive cooling system directs air over electronic components from an air-stream producing device, generally referred to herein as a fan. The fan can either be on the plug-in card or can be located off the card with the air stream directed to the components through ducting or other flow-directing devices. Fans within the scope of the present invention include, but are not limited to, fans having axial or centrifugal configurations, and fans having flow characteristics of a blower. In addition, fans for use with the present invention are chosen to provide sufficient cooling and an appropriate size and orientation for directing flow over the various components. Thus fans located on a heat sink are usually of the centrifugal fan configuration, drawing in air away from the board and directing the stream along the board, while axial fans may be used on off-board locations.

In one exemplary embodiment, the present invention is used to remove heat from a graphics card conforming to the Accelerated Graphics Port (AGP) bus standard for use on a personal computer (PC). FIG. 3 shows the inventive cooling system 310 on an AGP compatible device 300 in a top view, FIG. 4 shows a cross-sectional view 4—4 of FIG. 3, and FIG. 5 is an exploded assembly view of system 310. The AGP compatible device 300 includes card 101 that has a bracket 323 having a tab 319 and lip 321 for restraining the board in a computer enclosure (not shown). Among the various electronic components on card 101 are GPU 119 and memory chips 121. Device 300 also includes an augmented heat removal system 310 that includes a fan 303, heat sinks 305 and 307 for removal of heat from memory chips 121, and a flow directing device 301. In this embodiment, fan 303 is preferably a vertical blower with an axis perpendicular to both heat sink 305 and 307 and GPU 119. Fan 303 has a circular portion 409 through which air is drawn and a circumferential portion 411 through which air is forced. Fan 303 thus draws in air towards card 101 and diverts it along the card. Specifically, flow directing device 301 has a top 311 with and aperture 309 and an outer edge 313, and a housing 401 for mounting fan 303 and diverting flow along card 101. System 310 requires a height Z for proper cooling of device 300. The height Z includes the physical height X of system 310 components and an additional height Y to allow cooling air to drawn into fan 303. The direction of cooling air over specific components allows for more efficient use of cooling air and for directing the flow to uniformly cool a plurality of components, such as memory chips 121. In addition, system 310 requires a smaller height Z than is possible with prior art systems. As a result, system 310 can provide more cooling within a given size constraint, or can provide a given amount of cooling in a smaller space. Thus the present invention is useful in cooling boards within a given size constraint, such as an AGP standard board height, and in cooling boards that occupy a larger space, as in an AGP Pro board height.

An alternative system for cooling AGP device 800, which could be an AGP board, such as device 300, is shown in FIG. 8 as a top view of cooling system 810 and in a cross-sectional side view 9—9 in FIG. 9. System 810 includes a duct 801 having an inlet 803 and an outlet 805, fan 303, and top 311 halving aperture 309 in communication with outlet 805. Inlet 803 permits the inflow of air to device 810 and is shown located on a bracket 807, which is similar to bracket 323 with the addition of attached duct inlet 803. Inlet 803 may be open, or may have a grill or replaceable filter. Outlet 805 is attached to top 311 and coupled to aperture 309 to provide cooling by drawing in air external to the computer enclosure directly to fan 303. Since the external air is generally cooler than enclosure air, the use of duct 801 further reduces the height of the cooling system.

The introduction of ducting allows for alternative embodiments of the cooling system, which may include locating a fan to a position off of device 810, for example on bracket 807 or external to the computer enclosure and ducting the flow to duct 801, or by having multiple blowers or fans. Moving the fan or blower off of the plug-in board may be particularly advantageous, as this allows for the placing of higher performance heat sinks at board positions that would otherwise be occupied by a blower. Thus there are many alternative flow arrangements within the scope of the present invention including, but are not limited to, drawing in air from another locations, either internal or external to the computer housing, positioning fans at other locations, either internal or external to the computer enclosure.

It has been found by the inventor that the choice of a blower 303, as opposed to the conventional use of a fan, improves the heat transfer characteristics of the cooling device. Thus while the use a fan, blower or other air-stream producing devices are within the scope of the present invention, it is believed that the use of blowers may be advantageous due to the ability of a blower to provide a more uniform and stronger flow along the heat sinks. In addition, alternative devices for producing air flow according to the present invention include fans and the use of two or more fans or blowers, placed for example, on GPU 119 or on the GPU and used in conjunction with ducting to provide cooling air from other sections of the computer enclosure or from a location external to the enclosure.

Details of the invention to show features that augment cooling of the various electronic elements are shown in FIG. 6 as a top view of housing 401 and in FIG. 4 as cross-sectional view 4—4 of FIG. 3. Housing 401 has an area 403 for mounting blower 303 and a plurality of elongated members, such as vanes or fins 405 bounded by housing 401 on one side and top 311 on the other. The fins 405 and the housing bottom 317 form a plurality of openings 407, that along with top 311 form plurality of ducts from blower 303 to heat sinks 305 and 307. Aperture 309 is aligned with the inlet of blower 303 to permit the fan to draw in air (as seen in FIG. 4), while the plurality of openings 407, bound by top 311, restrain the flow and force the air along the surface of card 101, and more importantly along the top of GPU 119 and uniformly along heat sinks 305 and 307. As in the prior art, a heat sink can be positioned between blower 303 and GPU 119, preferably as a bottom 317 of flow diverting device 301. Flow directing device 301 thus permits fan 303 to draw in air and delivers air flow over heat sinks 305 and 307 that is directed across the heat sinks. Housing 401 or top 311 can also be easily adapted to redirect the flow by incorporating vanes, ducts, honeycombed, fanned sheet metal or other passageway containing structures, or other flow diverting structures or mechanisms. Housing bottom 317 is preferably made of a high thermal conductivity material, such as a metal or a graphite impregnated plastic, to provide cooling to GPU 119 as described below.

The operation of the present invention will now be described. In cooling computer chips or other electronic components mounted on a printed circuit board, any air flow directed along the surface of the plane is disrupted by the components. Thus, the ability to connectively cool the components by air flow is affected by the components themselves. At a component level the component side facing the flow will experience an increased convective heat transfer, while the leeward facing side will generally experience a stagnating flow of reduced convective heat transfer. For air flow directed along a plurality of components, the flow may stagnate between components or may even separate from the plane containing the components, further reducing the heat transfer. The present invention provides air flow along various heat generating components to cool the components to or within a specified temperature or temperature range.

The air flow provided by fan 303 and flow directing device 301 is shown by the wavy arrows in FIGS. 3, 4, and 6. Air is drawn in perpendicularly towards GPU 119 and is redirected by flow directing device 301 towards other components to be cooled, specifically heat sinks 305 and 307 which in turn cools the plurality of memory chips 121. Top 311 improves air flow specifically over heat sinks 305 and 307 by restricting the flow to remain near card 101, especially near the memory chips 121. As noted previously, the presence of the chips protruding from card 101 disturbs the flow. It has been found by the inventor of this invention that in some cases the flow separates from card 101 or recirculates, locally decreasing the heat transfer and resulting in a global variation in heat transfer, for example from chip to chip. Top 311 forces the flow to remain near chips 121 and inhibits the formation of recirculating flow. The result is improved uniformity and heat transfer predictability.

An important objective of the present invention includes the ability to direct flow over the card towards components that require cooling. To this end, there are many options and variations on the first housing embodiment 401 of FIG. 5. In general, all of the embodiments direct the flow in the general direction of the GPU 119 and plurality of memory chips 121, ducting redistributes the air flow along the chips to provide uniform or specifically tailored cooling requirements. Three alternative embodiments are presented in FIGS. 7A, 7B, and 7C as housing 701A, 701B, and 701C, respectively. In the embodiments of FIG. 7, similar components are differentiated by the suffix A, B or C and housing 701 will in general refer to housing 701A, 701B or 701C, or by other equivalent structures as would be obvious to one skilled in the art. As with the first embodiment, housings 701 have a bottom 717 for contacting GPU 119 and a fan receiving area 403. While the alternative embodiment providing cooling of GPU 119 and heat sinks 305 and 307, the flow ducting provided by their respective housings 701 and tops (as indicated by edge 313).

The first alternative embodiment of FIG. 7A includes barriers 703 that extend from bottom 717A to top 311A (not shown). In contrast to the first housing embodiment 401, housing 701A includes a bottom 717A that has edges 705 near memory chips 121, while barriers 703 extend outwards to partially surround heat sinks 305 and 307. Housing 701A does not include internal flow ducts or flow diverters, such as fins 405. In addition, edge 313A extends completely beyond heat sinks 305 and 307 such that they are covered by top 311A. The second alternative embodiment of FIG. 7B includes exterior barriers 707 and straight internal barriers 709 to provide tailored air flow. A third alternative embodiment of FIG. 7C includes barriers 711 that are individually curved in the direction of the fan rotation (shown by the semicircular arrow within fan receiving area 403). Matching the flow from a fan within fan receiving area 403 to individual heat sinks, and in particular to provide cooling that allows each component to be cooled to a given temperature, results in part from the manner in which flow is diverted from the fan to the individual components. Thus the size, spacing, height and orientation of barriers such as barriers 405, 709 or 711 are among the important features which determine the effectiveness of component cooling.

Alternative embodiment include other methods for redirecting flow to and from fan 303. Thus for example, fins 405 could be partial fins that do not span the entire distance from bottom 317 to top 311, or could include undulations or surface roughness to improve the ability to act as a heat sink for GPU 119. The ducting of flow provided by fins 405 may be provided by an insert or attachment to housing 401 made of a metal, plastic, or an easily manufactured material for directing the flow. Additionally, air flow may be diverted the flow could be accomplished by using a ducting insert, made of a honeycomb material, for example, or formed as part of a heat sink attached to memory chip rows 129 and 131, which themselves could have fins that provide a means for diverting flow to provide uniform or tailored flow. In addition, while fins 405 and barriers 709 are shown protruding from bottom 317 towards top 311, they could be formed as part of top 311 and protrude towards bottom 317, or they could be separate pieces to which the top and bottom attach.

As a further embodiment of the present invention, consider the alternative radial component layout illustrated in FIG. 10, which shows a card 101 having the plurality of memory chips 121 radially disposed about a GPU 119. FIG. 11 shows a top view of an inventive radial cooling system 1110 configured to cool radially disposed memory chips 121, each mounted to a heat sink 1101. Radial system 1110 includes a circularly symmetric top 1111 that has a circular aperture 1109 and a circular outer edge 1113, and a centrifugal fan or blower 1103 with a center of rotation located about the center of top 1111.

Two alternative radial system embodiments 1110 are shown as radial systems 1110A and 1110B in the cross-section views of FIGS. 12A and 12B, respectively. Each embodiment draws in air from above top 1111 and directs a flow radially outwards, as shown by the wavy arrows. Top 1111 directs the flow radially, reducing separation of the flow over heat sinks 1101. In the first radial embodiment 1110A, top 1111A is essentially flat, as in the previous embodiments. In the second radial embodiment 1110B, top 1111B has a varying height above board 101, decreasing from circular aperture 1109B to outer edge 1113B. As the flow diverges radially, the position of top 1111B relative to board 101 decreases. The shape of top 1111 can thus be used to taylor the flow over heat sinks 1110. Decreasing the height of the flow area as the flow radially diverges can improve the flow characteristics over the heat sinks 1110.

Other alternative radial embodiments include, but are not limited to, providing ducting to aperture 1103 from within the computer enclosure of from an external location, ducting the flow and providing a fan or blower off-board or outside of the enclosure, providing vanes between aperture 1109 and the heat sinks 1110 to further direct or modify the flow as described previously, and cooling multiple chips with each heat sink. In addition, memory chips 121 may be arranged radially on less than a full circle. Thus for example, memory chips 121 can be arranged along a semicircular arc or another circular plan of less than full circle. An alternative air flow arrangement may have air flow along board 101 emanating from a position other than the center of the arc, either by placing fan or blower 1103 at a position relative to the arc that is off-center from the arc, or ducting air to an off-center location.

The foregoing preferred embodiments are illustrative of the present invention, which addresses the cooling of multiple heat generating components in configurations that may hinder conventional convective cooling techniques. The invention has been described in terms of a cooling system to be used in conjunction with a computer plug-in board. As such the system can either be incorporated onto a board as manufactured, to be sold as a unit, or can be manufactured separate from the board to be installed as an add-on upgrade to an existing board.

In addition, it will be understood to those of skill in the art, that the invention also may be used to other cool multiple components in other restricted in environments. In a computer or other electronic device this may include components mounted within an enclosure or otherwise contained in or on a structure that limits the convective flow to such components. The invention is also applicable to unenclosed devices where the arrangement of components is such that normal air flow does not adequately cool the components. In addition, the present invention could also be practiced to heat components, if so desired. The invention should therefore not be taken as limited except as provided in the attached claims.

The invention has now been explained with regard to specific embodiments. Variations on these embodiments and other embodiments may be apparent to those of skill in the art. It is therefore intended that the invention not be limited by the discussion of specific embodiments. It is understood that the examples and embodiments described herein are for illustrative purposes only and that various modifications or changes in light thereof will be suggested to persons skilled in the art and are to be included within the spirit and purview of this application and scope of the appended claims.

What is claimed:

1. An apparatus for cooling electronic components, said apparatus comprising:

a heat sink bottom adapted for attachment to a primary electronic component;

a fan mounted on a first portion of said heat sink bottom;

a first plurality of heat sink fins disposed in a second portion of said heat sink bottom, said first plurality of heat sink fins shaped and positioned to form a first plurality of passages for ducting air from said fan to a first outlet region proximate a first edge of said heat sink bottom; and a second plurality of heat sink fins arranged in a third portion of said heat sink bottom, said second plurality of heat sink fins shaped and positioned to form a second plurality of passages for ducting air from said fan to a second outlet region proximate a second edge of said heat sink bottom;

wherein said fan, said first plurality of heat sink fins, and said second plurality of heat sink fins are operative to cool said primary electronic component and said first plurality of passages and said second plurality of passages are sized, shaped, and oriented to match a flow of air to each of a first plurality of secondary electronic components disposed adjacent said first edge and a second plurality of secondary electronic components adjacent said second edge.

2. The apparatus of claim 1, wherein said first plurality of heat sink fins includes a first plurality of curved heat sink fins shaped to redirect air towards said first edge and said second plurality of heat sink fins includes a second plurality of curved heat sink fins shaped to redirect air towards said second edge.

3. The apparatus of claim 1, wherein first plurality of heat sink fins includes a first plurality of curved heat sink fins.

4. The apparatus of claim 1, wherein said second plurality of heat sink fins includes a second plurality of curved heat sink fins.

5. The apparatus of claim 1, further including a top member, where said top member extends over at least a portion of said first plurality of passages and said second plurality of passages, wherein said top member includes an overhanging portion extending at least partially over said first plurality of secondary electronic components and said second plurality of electronic components.

6. The apparatus of claim 1, wherein said first edge and said second edge are disposed along orthogonal edges of said heat sink bottom.

7. The apparatus of claim 6, wherein said first plurality of heat sink fins includes a first plurality of curved heat sink fins and said second plurality of heat sink fins includes a second plurality of curved heat sink fins.

8. An apparatus for cooling electronic components, comprising:
 a heat sink housing having a heat sink bottom adapted for attachment to a primary electronic component mounted to a card;
 a fan mounted within said housing on a first portion of said heat sink bottom;
 a first plurality of heat sink fins disposed within said housing on a second portion of said heat sink bottom, each of said first plurality of heat sink fins extending continuously from a first region proximate said fan towards a first edge of said heat sink bottom to form a first plurality of passages for directing air from said fan towards said first edge;
 a second plurality of heat sink fins disposed within said housing on a third portion of said heat sink bottom, each of said second plurality of heat sink fins extending continuously from a second region proximate said fan towards a second edge of said heat sink bottom to form a second plurality of passages for directing air from said fan towards said second edge; and
 said heat sink housing including a top member extending over at least a portion of a first plurality of secondary electronic components disposed adjacent said first edge and said top member also extending over at least a portion of a second plurality of secondary electronic components disposed adjacent said second edge, said top member restricting air to flow parallel to a plane of said card over said first plurality of secondary electronic components and said second plurality of secondary electronic components;
 wherein said fan, said first plurality of heat sink fins, said second plurality of heat sink fins, and said housing are operative to remove heat from said primary electronic component and preferentially direct air towards said first edge and said second edge of said heat sink bottom to cool said first plurality of secondary electronic components and said second plurality of secondary electronic components.

9. The apparatus of claim 8, wherein a secondary heat sink is mounted onto each secondary electronic component, each said secondary heat sink extending to a height above said card such that air from said fan strikes at least a portion of said secondary heat sink.

10. The apparatus of claim 8, wherein said second plurality of heat sink fins includes a second plurality of curved heat sink fins.

11. The apparatus of claim 8, wherein said first plurality of heat sink fins includes a first plurality of curved heat sink fins and said second plurality of heat sink fins includes a second plurality of curved heat sink fins.

12. The apparatus of claim 10, wherein said primary electronic component is a graphics processor and wherein a graphics memory comprises said first plurality of secondary electronic components and said second plurality of secondary electronic components.

13. An apparatus for cooling electronic components, comprising:
 a heat sink base surface adapted for attachment to a primary electronic component mounted to a card;
 a plurality of heat sink fins positioned on a first portion of said heat sink base surface, said plurality of heat sink fins forming passages that terminate at two separate edges associated with said heat sink base surface;
 a fan mounted on a second portion of said heat sink base surface to drive air through said plurality of heat sink fins; and
 a heat sink top covering at least a portion of said plurality of heat sink fins and thereby forming a cover for said passages, said heat sink top extending beyond the perimeter of said plurality of heat sink fins to cover at least a portion of a plurality of secondary electronic components positioned adjacent to said primary electronic component along said two edges to restrict air to flow parallel to a plane of said card over said plurality of secondary electronic components, said plurality of heat sink fins, said fan, and said heat sink top operating to remove heat from said primary electronic component and said first plurality of passages and said second plurality of passages are sized, shaped, and oriented to match a flow of air to cool said plurality of secondary electronic components.

14. The apparatus of claim 13 wherein a secondary heat sink is mounted onto each secondary electronic component, each said secondary heat sink extending to a height above said card such that air from said fan strikes at least a portion of said secondary heat sink.

15. The apparatus of claim 13 wherein said plurality of heat sink fins includes heat sink fins with curved surfaces.

16. The apparatus of claim 13 wherein said primary electronic component is a graphics processor.

17. The apparatus of claim 13 wherein said secondary electronic components are memory chips.

18. A graphics apparatus, comprising:
 a primary graphics component requiring cooling, said primary graphics component mounted on a graphics card;
 at least two secondary graphics components requiring cooling, said secondary graphics components mounted on said graphics card and spaced apart from said primary graphics component along two edges of said primary graphics component;

a heat sink base surface attached to a surface of said primary graphics component;

a fan mounted on a first portion of said heat sink base surface;

a plurality of heat sink fins positioned on a second portion of said heat sink base surface about at least a portion of the periphery of said fan, said plurality of heat sink fins forming a plurality of passages having inlets proximate said fan and at least one outlet proximate each of said at least two secondary graphics components;

a heat sink top covering at least a portion of said plurality of heat sink fins and thereby forming a cover for said passages, said heat sink top extending over at least a portion of said at least two secondary graphics components to restrict air to flow in a plane parallel to said graphics card over said at least two secondary graphics components;

wherein said heat sink base surface, said plurality of heat sink fins, said fan, and said heat sink top are operative to remove heat from said primary graphics component and to preferentially direct air from said fan towards each of said secondary graphics components, said plurality of passages being sized, shaped, and oriented to match a flow of air to cool said at least two secondary graphics components.

19. The apparatus of claim 18 wherein secondary heat sink is mounted onto each secondary electronic component, each said secondary heat sink extending to a height above said card such that air from said fan strikes at least a portion of said secondary heat sink.

20. The apparatus of claim 18, wherein there are at least two secondary components disposed along at least two different directions with respect to said heat sink surface, and said passages redirect the flow of air towards the at least two secondary components.

21. The apparatus of claim wherein 18 wherein said plurality of heat sink fins includes heat sink fins with curved surfaces.

22. The apparatus of claim 18 wherein said primary graphics component comprises: a graphics processor.

23. The apparatus of claim 18 wherein said at least one secondary graphics component comprises: memory chips.

* * * * *